(12) United States Patent
Ishida et al.

(10) Patent No.: US 7,692,240 B2
(45) Date of Patent: Apr. 6, 2010

(54) INSULATED GATE SEMICONDUCTOR DEVICE

(75) Inventors: Hiroyasu Ishida, Gunma (JP); Yasunari Noguchi, Gunma (JP)

(73) Assignee: Sanyo Electric Co., Ltd., Moriguchi-shi (JP)

(*) Notice: Subject to any disclaimer, the term of this patent is extended or adjusted under 35 U.S.C. 154(b) by 2 days.

(21) Appl. No.: 11/797,900

(22) Filed: May 8, 2007

(65) Prior Publication Data

US 2007/0262390 A1 Nov. 15, 2007

(30) Foreign Application Priority Data

May 10, 2006 (JP) ................. 2006-131820

(51) Int. Cl.
*H01L 29/94* (2006.01)
(52) U.S. Cl. .............. 257/339; 257/368; 257/409; 257/E29.008
(58) Field of Classification Search ......... 257/287, 257/341–343, 368, 401, 168, 339, 409, 605, 257/391, 394, 170, 484, 490, 494, 495, E29.008, 257/E29.012, E29.013, E29.12; 438/197, 438/201
See application file for complete search history.

(56) References Cited

U.S. PATENT DOCUMENTS 5,726,472 A * 3/1998 Higashida .................. 257/341
5,767,550 A * 6/1998 Calafut et al. ............... 257/355
5,905,294 A * 5/1999 Kushida ..................... 257/409
6,369,424 B1 * 4/2002 Nakamura et al. .......... 257/339
6,563,169 B1 * 5/2003 Miyakoshi et al. ......... 257/339
6,818,958 B2 * 11/2004 Spring ....................... 257/395
6,873,011 B1 * 3/2005 Huang et al. ............... 257/345
6,930,354 B2 * 8/2005 Shirai et al. ................ 257/330
7,011,999 B2 * 3/2006 Minami et al. ............. 438/210
2005/0184338 A1 * 8/2005 Huang et al. ............... 257/335
2005/0242401 A1 * 11/2005 Cho et al. ................... 257/368

FOREIGN PATENT DOCUMENTS

JP 02199870 A * 8/1990
JP 10270679 A * 10/1998
JP 2002-368218 12/2002

* cited by examiner

*Primary Examiner*—Sue Purvis
*Assistant Examiner*—Teresa M Arroyo
(74) *Attorney, Agent, or Firm*—Morrison & Foerster LLP (57) ABSTRACT

Channel regions and gate electrodes are also disposed continuously with transistor cells below a gate pad electrode. The transistor cells are formed in a stripe pattern and allowed to contact a source electrode. In this way, the channel regions and the gate electrodes, which are positioned below the gate pad electrode, are kept at a predetermined potential. Thus, a predetermined drain-source reverse breakdown voltage can be secured without providing a p+ type impurity region on the entire surface below the gate pad electrode.

7 Claims, 8 Drawing Sheets

Prior Art

FIG.7B

Prior Art

FIG.8A

Prior Art

FIG.8B

Prior Art

INSULATED GATE SEMICONDUCTOR DEVICE

This application claims priority from Japanese Patent Application No. 2006-131820, filed May 10, 2006, the content of which is incorporated herein by reference in its entirety.

BACKGROUND OF THE INVENTION

1. Field of the Invention

The present invention relates to an insulated gate semiconductor device, and more particularly relates to an insulated gate semiconductor device which can maintain a high reverse breakdown voltage by securing a sufficient operation region area.

2. Description of the Related Art

In a conventional insulated gate semiconductor device, no transistor cell is disposed below a gate pad electrode. This technique is described for instance in Japanese Patent Application Laid-open Publication No. 2002-368218.

In addition, a protection diode having a plurality of series-connected pn junctions, for example, may be disposed below a gate pad electrode. Otherwise, a diffusion region of high-concentration impurities may also be formed in a substrate below a gate pad electrode, in order to secure a drain-source reverse breakdown voltage.

Figure 7A:
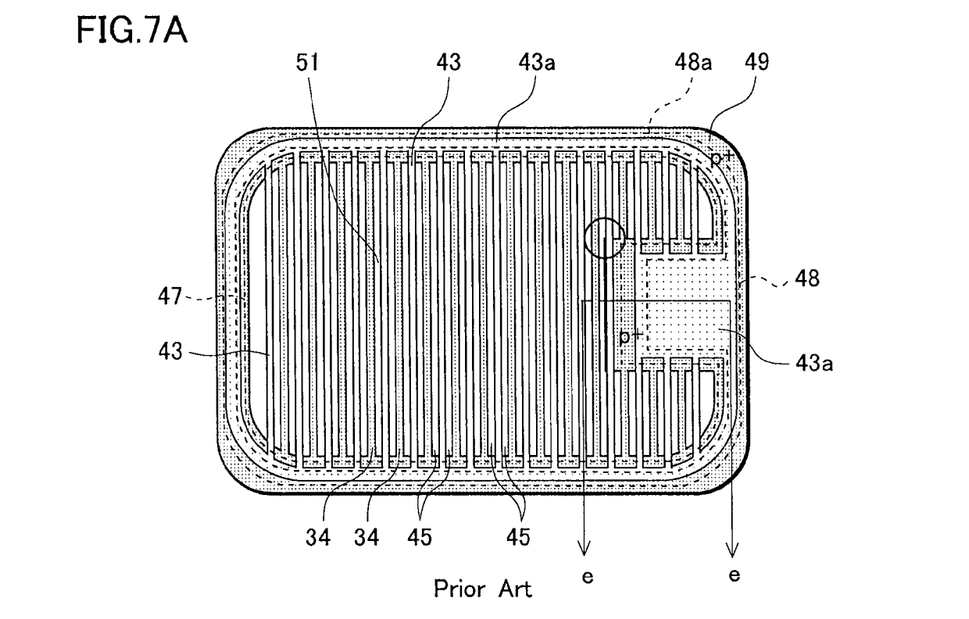
FIG. 7A is a plan view and FIG. 7B is a cross-sectional view showing a conventional semiconductor device.
Figure 7B:
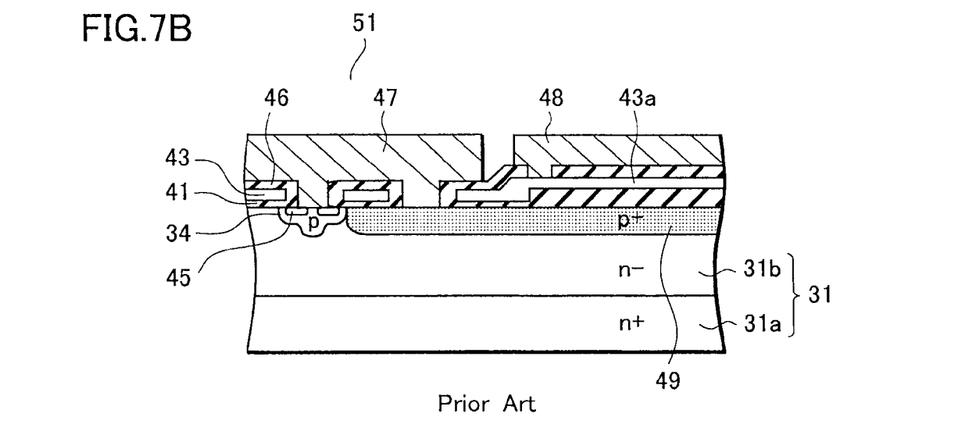

FIGS. 7A and 7B show an example of an n channel MOSFET having a p+ type impurity region provided below a gate pad electrode, as the conventional insulated gate semiconductor device.

FIG. 7A is a plan view of the MOSFET. Note that, in FIG. 7A, interlayer insulating films on a surface of a substrate is omitted, and a metal electrode layer (a source electrode 47, a gate pad electrode 48 and a gate wiring 48a) is indicated by a broken line.

Gate electrodes 43 are provided in a stripe pattern on a surface of a semiconductor substrate 31 with gate oxide films 41 interposed therebetween. The gate electrodes 43 are provided by depositing and patterning polysilicon, and a resistance thereof is reduced by introducing impurities thereinto. Source regions 45 are provided in a stripe pattern on the surface of the substrate 31 along the gate electrodes 43.

The source electrode 47 is provided on an operation region 51 in which a transistor cell is disposed, and the gate pad electrode 48 is disposed at an end of a chip. Around the chip, the gate wiring 48a connected to the gate pad electrode 48 is provided.

A gate extraction electrode 43a is provided in a pattern approximately overlapping with the gate pad electrode 48 and the gate wiring 48a. Moreover, in an n− type semiconductor layer (an n− type epitaxial layer) 31b below the gate extraction electrode 43a, a p+ type impurity region 49 is provided in a pattern approximately overlapping with the gate extraction electrode 43a.

FIG. 7B is a cross-sectional view taken along the line e-e in FIG. 7A.

In the semiconductor substrate 31, a drain region is provided by placing the n− type semiconductor layer (the n− type epitaxial layer) 31b on an n+ type silicon semiconductor substrate 31a, and the like. On the surface of the substrate 31, a plurality of p type channel regions 34 are provided in a stripe pattern. On the surface of the substrate 31 between the channel regions 34, a plurality of the gate electrodes 43 are disposed in the stripe pattern with gate insulating films 41 interposed therebetween. On the surfaces of the channel regions 34 adjacent to the gate electrodes 43, n+ type source regions 45 are formed. The gate electrodes 43 are covered with interlayer insulating films 46, and the source electrode 47 is provided thereon, which contacts the source regions 45. A region surrounded by the gate electrodes 43 becomes one transistor cell, and a number of the transistor cells are arranged to form the operation region 51.

The gate pad electrode 48 is provided on the surface of the n− type semiconductor layer 31b outside the operation region 51, and contacts the gate extraction electrode 43a connected to the gate electrode 43 in the operation region 51. The p+ type impurity region 49 is provided in a pattern similar to that of the gate extraction electrode 43a.

The p+ type impurity region 49 is connected to the channel region 34 and secures a source-drain reverse breakdown voltage by relieving electric field concentration at the end of the chip.

Specifically, the p+ type impurity region 49 is required to be provided in a pattern similar to that of the gate extraction electrode 43a, the pattern approximately overlapping with the gate extraction electrode 43a. Therefore, for example, in the case of the pattern in which the gate extraction electrode 43a is disposed on the entire surface below the gate pad electrode 48 as shown in FIGS. 7A and 7B, the p+ type impurity region 49 is also required to have a large area corresponding thereto.

Figure 8A:
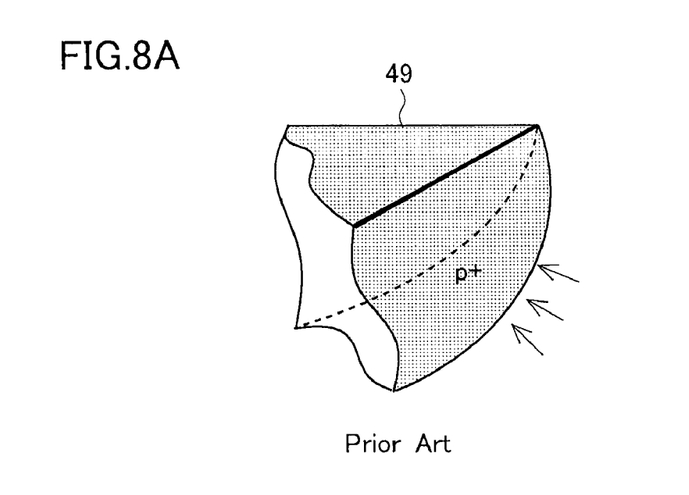
FIG. 8A is a perspective view and FIG. 8B is a plan view showing the conventional semiconductor device.
Figure 8B:
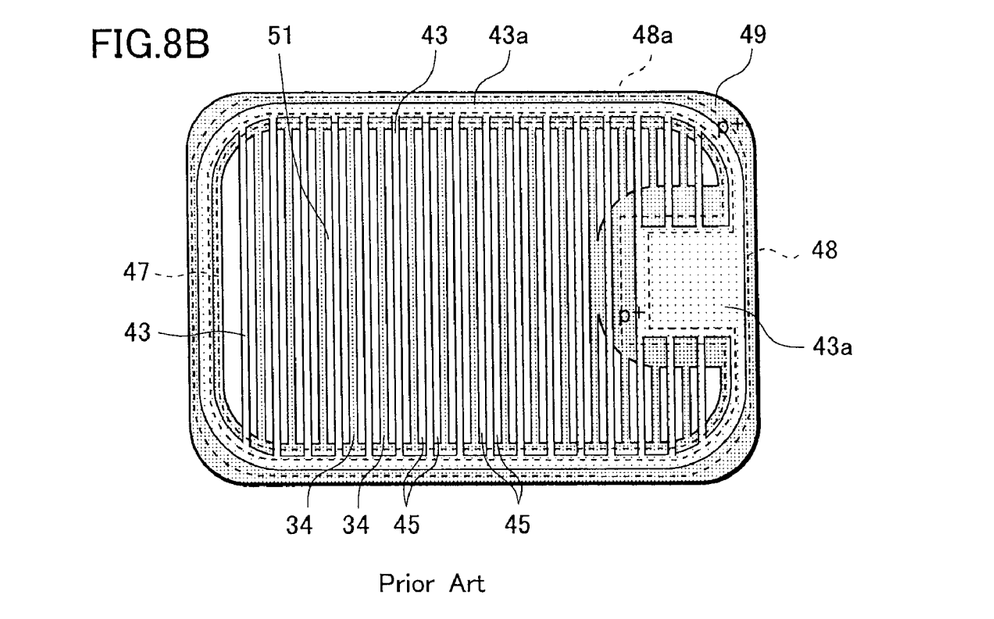

FIGS. 8A and 8B are views for explaining the p+ type impurity region 49. FIG. 8A is a perspective view of the p+ type impurity region 49 in a circled portion shown in FIG. 7A, when seen from the operation region 51 in which the transistor cell (MOSFET) is disposed. FIG. 8B is a plan view showing another p+ type impurity region 49, with interlayer insulating films on a surface omitted, and with a metal electrode layer indicated by a broken line.

The p+ type impurity region 49 is a diffusion region and has a spherical curvature at the edge (a junction surface with the n− type epitaxial layer 31b) indicated by the circle in FIG. 7A (FIG. 8A). Here, in the pattern shown in FIGS. 7A and 7B, when a higher drain-source reverse breakdown voltage (for example, several hundred V) is required, a strong electric field is concentrated in the portion having the spherical curvature (the portion indicated by the arrows in FIG. 8A). Accordingly, there is a problem that a desired drain-source reverse breakdown voltage cannot be obtained.

Moreover, in order to reduce an on-resistance of the insulated gate semiconductor device, it is necessary to reduce a specific resistance of the n− type epitaxial layer 31b, for example. In such a case, the pattern of the p+ type impurity region 49 shown in FIGS. 7A and 7B also has a problem that the drain-source reverse breakdown voltage is deteriorated.

Specifically, when characteristics required for the operation region 51 are changed, it is necessary to change the pattern of the p+ type impurity region 49 separately from the operation region 51, in order to obtain a predetermined drain-source reverse breakdown voltage.

To be more specific, by reducing the spherical curvature, a sufficient drain-source reverse breakdown voltage can be secured. In other words, as shown in FIG. 8B, by reducing a curvature in a planar pattern of a corner portion of the p+ type impurity region 49, the spherical curvature shown in FIG. 8A can accordingly be reduced. Thus, the predetermined reverse breakdown voltage can be secured.

However, when the gate extraction electrode 43a is provided in the pattern approximately overlapping with the gate pad electrode 48 therebelow, the curvature radius of the corner portion of the p+ type impurity region 49 having the same pattern as that of the gate extraction electrode 43a is increased. Because of this, in the pattern shown in FIGS. 7A and 7B, some of the transistor cells near the gate pad electrode

48 cannot be disposed. Consequently, there is a problem that the operation region (a disposition area of the transistor cells) has to be reduced.

SUMMARY OF THE INVENTION

The invention provides an insulated gate semiconductor device that includes a semiconductor substrate of a first general conductivity type, a plurality of gate electrodes formed on the semiconductor substrate and arranged in a first stripe pattern, a plurality of channel regions of a second general conductivity type formed on the semiconductor substrate and arranged in a second stripe pattern, the first and second stripe patterns being oriented in a first direction, a first insulating film disposed between the channel regions and the gate electrodes, a plurality of source regions of the first general conductivity type formed in corresponding channel regions and arranged in a third stripe pattern oriented in the first direction, a second insulating film disposed on the gate electrodes, and a gate pad electrode disposed on the second insulating film so as to cover part of the channel regions.

The invention also provides an insulated gate semiconductor device that includes a semiconductor substrate of a first general conductivity type, a plurality of gate electrodes formed on the semiconductor substrate and arranged in a first stripe pattern, a plurality of channel regions of a second general conductivity type formed on the semiconductor substrate and arranged in a second stripe pattern, the first and second stripe patterns being oriented in a first direction, a first insulating film disposed between the channel regions and the gate electrodes, a plurality of source regions of the first general conductivity type formed in corresponding channel regions and arranged in a third stripe pattern oriented in the first direction, a second insulating film disposed on the gate electrodes, a gate pad electrode disposed on the second insulating film, a gate extraction electrode disposed in a periphery of the semiconductor substrate and connecting the gate electrodes and the gate pad electrode, and a high-concentration region of the second general conductivity type formed on the substrate below the gate extraction electrode and connected with the channel regions. In this device part of the channel regions, part of the gate extraction electrode and part of the gate electrodes are located below the gate pad electrode and corresponding portion of the second insulating film.

The invention further provides an insulated gate semiconductor device that includes a semiconductor substrate, a plurality of elongated transistor structures formed on the substrate and oriented in a first direction, each of the elongated transistor structures comprising a channel region and a gate electrode, a gate pad electrode connected with the gate electrodes and covering a first portion of the elongated transistor structures, and a source electrode covering a second portion of the elongated transistor structures. In this device source regions are formed in the channel regions under the source electrode, and no source region is formed in the channel regions under the gate pad electrode pad.

DESCRIPTION OF THE EMBODIMENTS

With reference to FIGS. 1 to 6, preferred embodiments of the present invention will be described in detail by taking an n channel MOSFET as an example of an insulated gate semiconductor device.

Figure 1A:
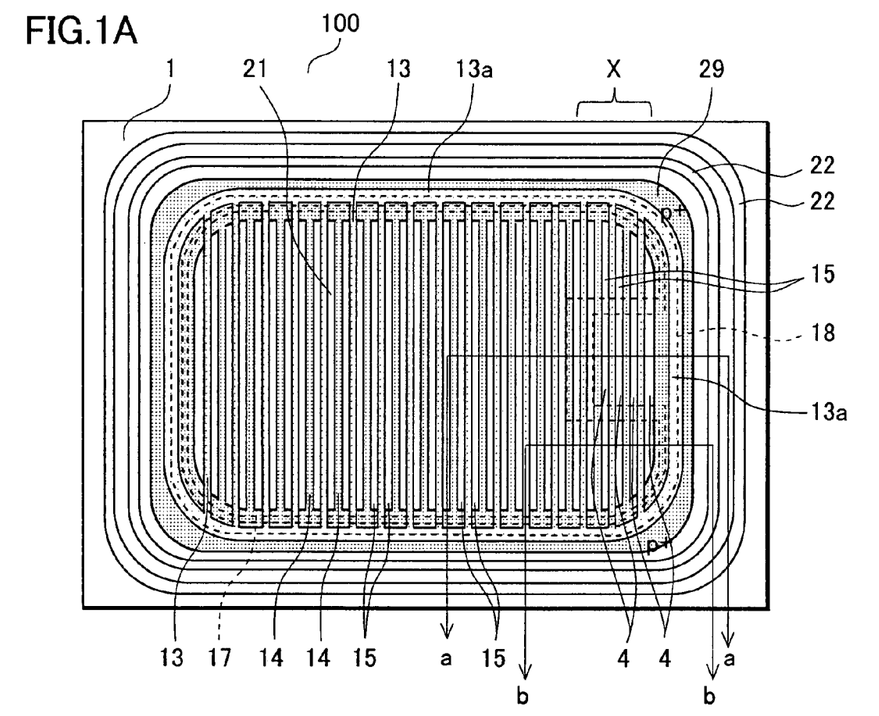
FIGS. 1A and 1B are plan views showing a semiconductor device of a first embodiment of a present invention.
Figure 1B:
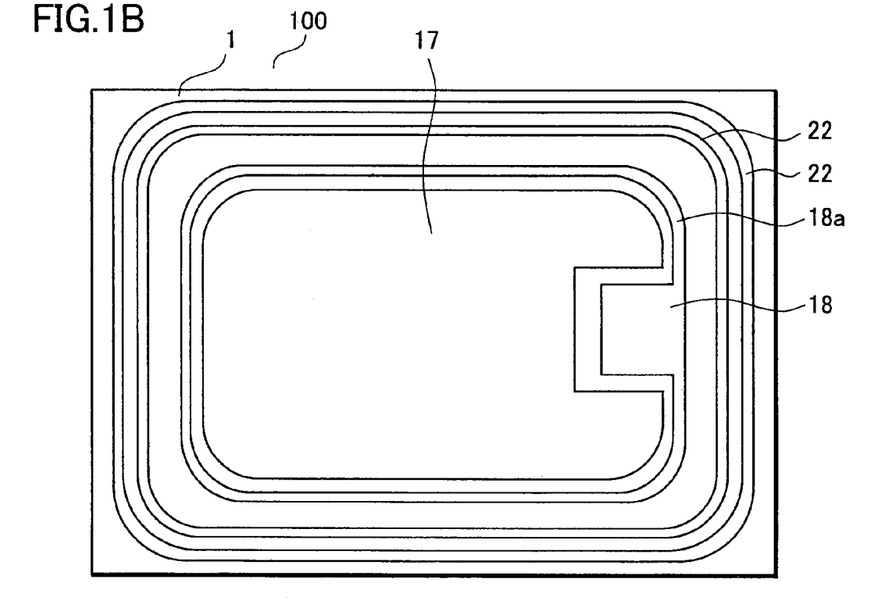
Figure 2:
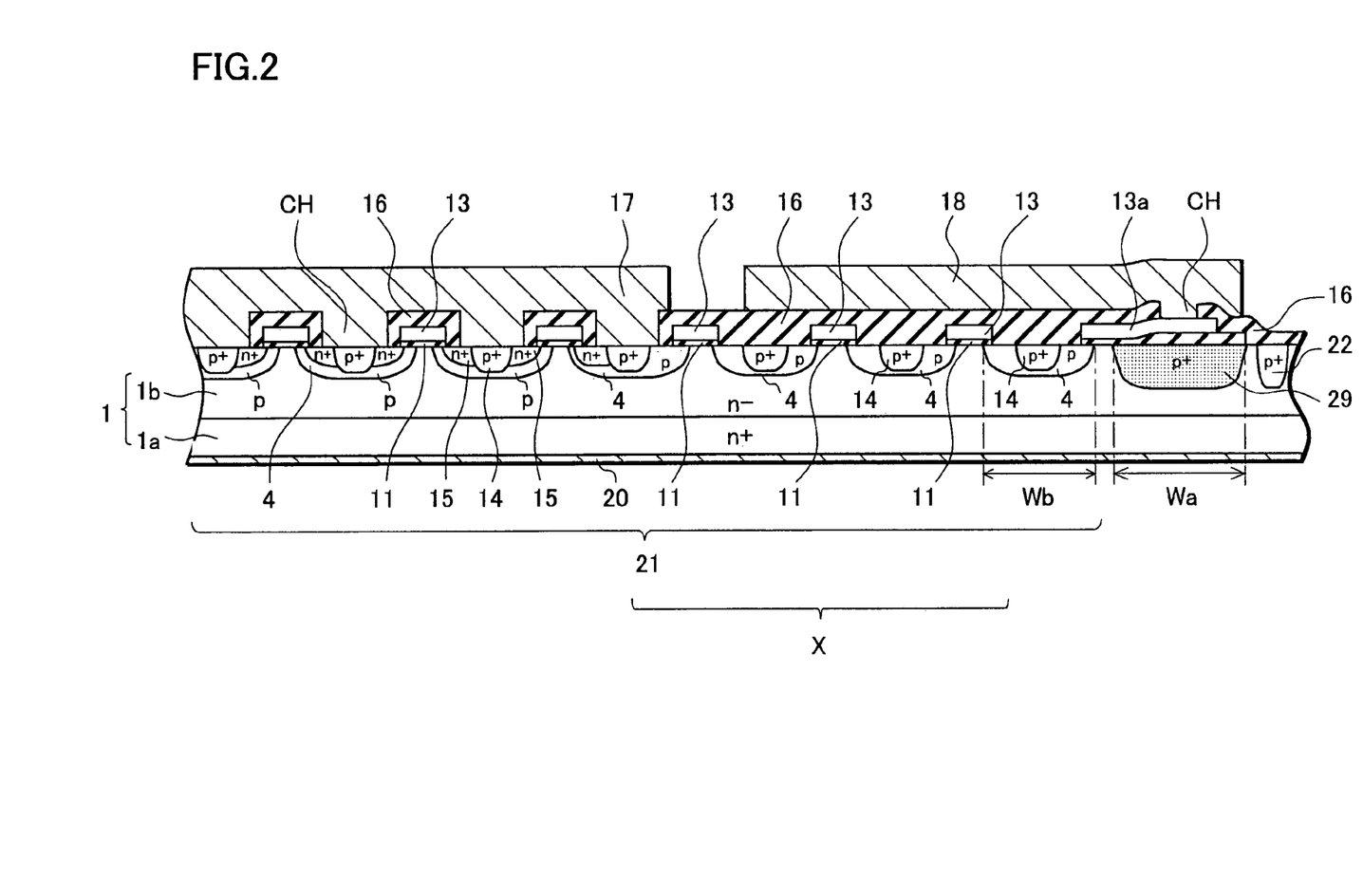
FIG. 2 is a cross-sectional view showing the semiconductor device of the first embodiment of the present invention.
Figure 3:
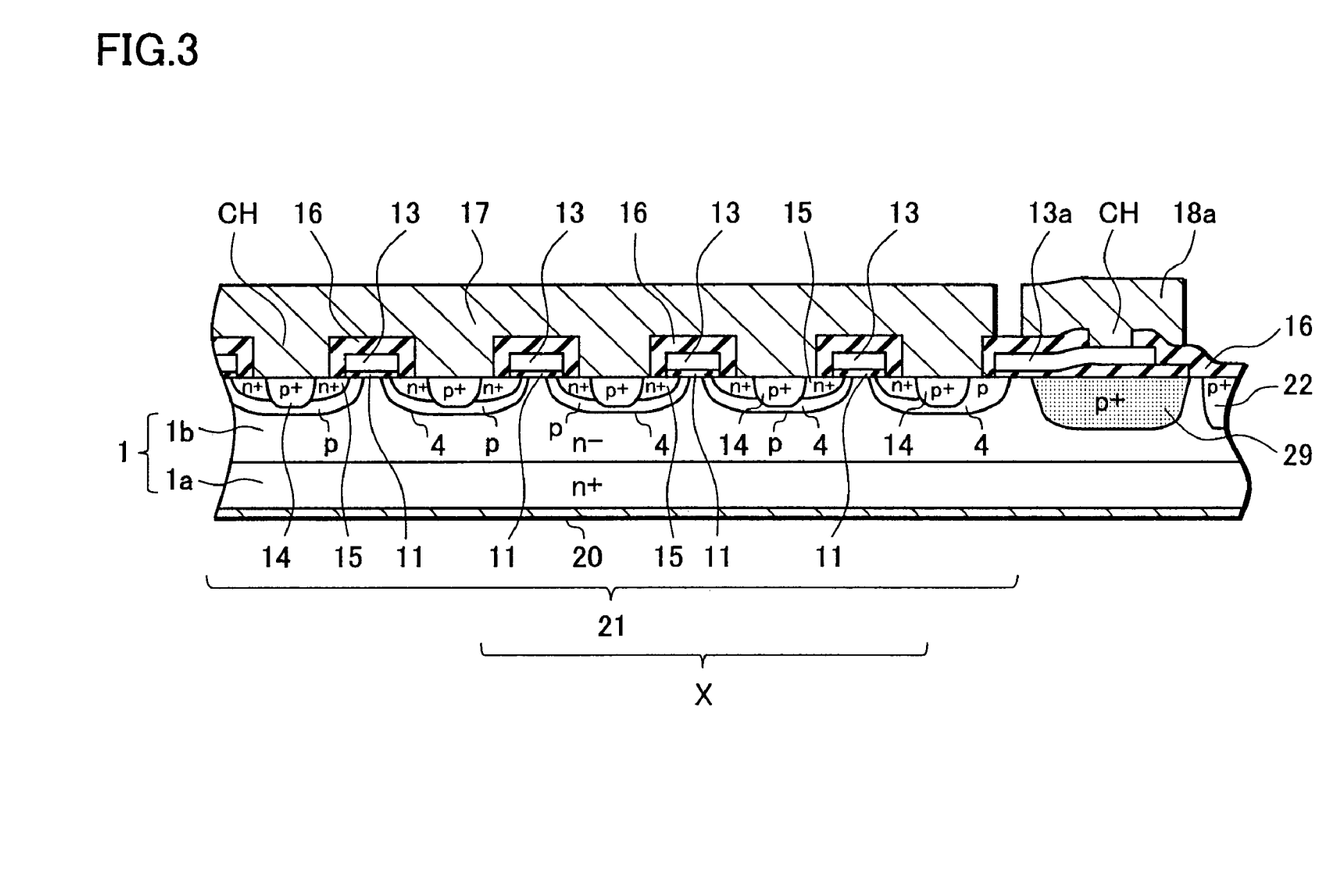
FIG. 3 is a cross-sectional view showing the semiconductor device of the first embodiment of the present invention.

FIGS. 1 to 3 show a first embodiment of the present invention.

FIGS. 1A and 1B are plan views of a chip of a MOSFET according to the first embodiment of the present invention. FIG. 1A is a plan view in which interlayer insulating films are omitted and a metal electrode layer (a source electrode, a gate pad electrode and a gate wiring) is indicated by a broken line. FIG. 1B is a plan view showing patterns of the source electrode, the gate pad electrode and the gate wiring.

A MOSFET 100 of the first embodiment of the present invention includes an n type semiconductor substrate 1, channel regions 4, first insulating films 11, gate electrodes 13, source regions 15, body regions 14, second insulating films 16, a gate pad electrode 18 and a source electrode 17.

As shown in FIG. 1A, the gate electrodes 13 are provided in a stripe pattern on the n type semiconductor substrate 1 with gate oxide films (not shown here) interposed therebetween, which are to be the first insulating films provided on a surface of the n type semiconductor substrate 1. The gate electrodes 13 are provided by depositing and patterning polysilicon, and a resistance thereof is reduced by introducing impurities thereinto.

The channel regions 4 are p type impurity regions provided in a stripe pattern on the surface of the n type semiconductor substrate 1 along the gate electrodes 13.

The source regions 15 are n+ type impurity regions provided on the surfaces of the channel regions 4 along the gate electrodes 13. The body regions 14 are p+ type impurity regions provided along the gate electrodes 13 on the surfaces of the channel regions 4 between the source regions 15 adjacent to each other for stabilizing a potential of the substrate.

It is noted that the impurity types such as n+, n and n− belong to one general conductivity type and the impurity types such as p+, p and p− belong to another general conductivity type.

The source regions 15 and the channel regions 4 (the body regions 14), which are surrounded by the gate electrodes 13, form transistor cells of the stripe patterned MOSFET. A number of the transistor cells are arranged to form an operation region 21 of the MOSFET 100. The transistor cells reach an end of the chip, and all the gate electrodes 13 are connected to a gate extraction electrode 13a which is disposed on the n type semiconductor substrate 1 with gate oxide films interposed therebetween so as to surround a periphery of the operation region 21. As in the case of the gate electrodes 13, the gate extraction electrode 13a is also formed of polysilicon, of which resistance is reduced by introducing impurities thereinto. The gate extraction electrode 13a is provided below the gate pad electrode 18 and connected thereto.

The gate pad electrode 18 is disposed along one side of the chip. Note that FIGS. 1A and 1B show an example where the gate pad electrode 18 is disposed around a center of the one side of the chip. However, the gate pad electrode 18 may be disposed at a corner portion of the chip. The gate pad electrode 18 is a metal electrode layer provided on the n+ type semiconductor substrate 1 with interlayer insulating films (not shown here) interposed therebetween, which is to be the second insulating films. Moreover, a gate wiring 18*a* connected to the gate pad electrode 18 and formed of the same metal electrode layer as the gate pad electrode 18 is provided on the n type semiconductor substrate so as to surround the periphery of the operation region 21. The gate wiring 18*a* also contacts the gate extraction electrode 13*a*. Accordingly, a gate voltage is applied to the gate electrodes 13 in each of the transistor cells.

The gate extraction electrode 13*a* is provided in a ring-shaped pattern similar to that of the gate wiring 18*a* so as to approximately overlap therewith. The gate extraction electrode 13*a* is disposed also below the gate pad electrode 18 but is not provided on the entire surface below the gate pad electrode 18. On the surface of the n type semiconductor substrate 1 below the gate extraction electrode 13*a*, a p+ type impurity region 29 is provided in a ring-shaped pattern approximately overlapping with the gate extraction electrode 13*a*. Specifically, the p+ type impurity region 29 is also disposed below the gate pad electrode 18 but is not provided on the entire surface below the gate pad electrode 18.

In this embodiment, as shown in FIG. 1A, below the gate pad electrode 18, part of the channel regions 4 in the stripe pattern, part of the gate electrodes 13 in the stripe pattern, a part of the ring-shaped gate extraction electrode 13*a* and a part of the ring-shaped p+ type impurity region 29 are disposed. The gate pad electrode 18 does not contact the gate electrodes 13, the channel regions 4 and the body regions 14, all of which are disposed therebelow, but contacts with the gate extraction electrode 13*a*. Moreover, the p+ type impurity region 29 surrounding the periphery of the chip is connected to the channel regions 4 in the stripe pattern, and the same source potential as that of the channel regions 4 is applied thereto.

The source regions 15 are not disposed in the channel regions 4 below the gate pad electrode 18, details to be described later.

On the surface of the n type semiconductor substrate 1 around the gate extraction electrode 13*a*, a guard ring 22 having p+ type impurities diffused therein is disposed according to need. The guard ring 22 is, for example, a p type impurity region to which no potential is applied.

As shown in FIG. 1B, the source electrode 17 surrounds the gate pad electrode 18 and is provided adjacent thereto. The source electrode 17 is formed of the same metal electrode layer as the gate pad electrode 18, covers a large part of the operation region 21, and is electrically connected to each of the transistor cells.

The transistor cells in this embodiment have a stripe pattern. Therefore, the source electrode 17 applies a predetermined potential also to the transistor cells (the transistor cells in a region X shown in FIG. 1A) in which part of the channel regions 4 overlap with the gate pad electrode 18 (see FIG. 1B). Accordingly, the potential is fixed and a transistor operation is performed.

Note that, in this embodiment, the source regions 15 are not disposed below the gate pad electrode 18, and the source regions 15 are divided on both sides of the gate pad electrode 18 in the transistor cells in the region X. Specifically, in the plan view of FIG. 1A, the body regions 14 are disposed on the surfaces of the channel regions 4 in the operation region 21 below the source electrode 17. Thus, the channel regions 4 are not exposed. Meanwhile, below the gate pad electrode 18, the channel regions 4 adjacent to the gate electrodes 13 are exposed.

Therefore, although predetermined potentials (a gate potential and a source potential) are applied to the gate electrodes 13 and the channel regions 4 in the stripe pattern, the transistor operation is performed only below the source electrode 17.

FIGS. 2 and 3 are cross-sectional views showing the MOSFET of this embodiment. FIG. 2 is a cross-sectional view taken along the line a-a in FIG. 1A. FIG. 3 is a cross-sectional view taken along the line b-b in FIG. 1A.

In the n type semiconductor substrate 1, a drain region is formed by laminating an n– type semiconductor layer 1*b* on an n+ type silicon semiconductor substrate 1*a*, and the like. The n– type semiconductor layer 1*b* is, for example, an epitaxial layer. On a surface of the n– type semiconductor layer, a plurality of the channel regions 4 are provided in the stripe pattern.

On the surfaces of the channel regions 4 below the source electrode 17, the source regions 15 as the n+ type impurity regions and the body regions 14 as the p+ type impurity regions are provided. On the surface of the substrate between the channel regions 4 adjacent to each other, the gate electrodes 13 made of polysilicon are disposed in the stripe pattern with gate oxide films 11 interposed therebetween. The source regions 15 are provided on both sides of the gate electrodes 13 so as to partially overlap therewith. On the surfaces of the channel regions 4 between the source regions 15 adjacent to each other, the body regions 14 are disposed.

Specifically, along the gate electrodes 13 in the stripe pattern, the channel regions 4, the source regions 15 and the body regions 14 are disposed each in the stripe pattern, on both sides of the gate electrodes 13.

On upper and side surfaces of the gate electrodes 13, interlayer insulating films 16 made of BPSG (Boron Phosphorus Silicate Glass) film or the like is provided. Accordingly, the gate electrodes 13 are covered with the gate insulating films 11 and the interlayer insulating films 16.

On the interlayer insulating films 16, the gate pad electrode 18, the gate wiring 18*a* and the source electrode 17 are provided by patterning a metal electrode layer into a desired shape (see FIG. 1B).

As shown in FIG. 2, below the source electrode 17, contact holes CH are provided in the interlayer insulating films 16. Through the contact holes CH, the source electrode 17 contacts the source regions 15 and the body regions 14 (the channel regions 4).

As in the structure below the source electrode 17, the gate electrodes 13, the body regions 14, the channel regions 4, the gate oxide films 11 and the interlayer insulating films 16 are also disposed below the gate pad electrode 18. However, no contact holes are provided in the interlayer insulating films 16 disposed among those described above. The gate pad electrode 18 contacts the gate extraction electrode 13*a* through a contact hole CH provided in the interlayer insulating films 16 but does not contact the body regions 14 and the channel regions 4.

Moreover, as described before, the source regions 15 are not disposed in the channel regions 4 below the gate pad electrode 18.

Specifically, as shown in FIG. 2, no transistor cells are formed below the gate pad electrode 18 in the region X.

Meanwhile, as shown in FIG. 3, the gate electrodes 13 and the channel regions 4, both of which have the stripe pattern, in the region X are extended to be disposed below the source electrode 17. Since the source regions 15 are provided below the source electrode 17, the transistor cells are formed below the source electrode 17 (FIG. 3). In this embodiment, a region where the channel regions 4 are disposed is set to be the operation region 21 in FIGS. 2 and 3.

Moreover, the p+ type impurity region 29 below the gate pad electrode 18 and the gate wiring 18a is provided so as to surround the periphery of the chip and is connected to the channel regions 4 in the stripe pattern (FIG. 1A). Accordingly, the p+ type impurity region 29 and the channel regions 4 are set to have the same potential (the source potential). Thus, electric field concentration below the gate pad electrode 18 when a reverse voltage is applied between the source and the drain can be relieved.

According to need, the guard ring 22 that is a p+ type impurity diffusion region is provided around the p+ type impurity region 29. No potential is applied to the guard ring 22. The guard ring 22 relieves the electric field concentration caused between the source and the drain in the vicinity of the p+ type impurity region 29.

Moreover, a drain electrode 20 which contacts the n+ type semiconductor substrate 1a is provided on a rear surface of the n type semiconductor substrate 1.

In this embodiment, a width of the gate extraction electrode 13a below the gate pad electrode 18 and a width of the p+ type impurity region 29 are significantly reduced compared with the conventional case. Moreover, the channel regions 4, the gate electrodes 13, the body regions 14 and the like are disposed also on the surface of the n type semiconductor substrate 1 below the gate pad electrode 18.

The source potential is applied to the channel regions 4 below the gate pad electrode 18, as in the case of the channel regions 4 in the transistor cells. Moreover, the channel regions 4 (and the body regions 14) below the gate pad electrode 18 are formed to have the same pattern as that of the operation region 21. The channel regions 4 (and the body regions 14) in the operation region 21 are formed under conditions that enable securing of a breakdown voltage required for the MOSFET. Specifically, the same drain-source reverse breakdown voltage as that in the operation region 21 can be secured also in the channel regions 4 below the gate pad electrode 18.

Note that a width Wa (FIG. 2) of the p+ type impurity region 29 is larger than a width Wb of the channel region 4 and is 50 μm, for example, when a breakdown voltage is about 600 V. When the p+ type impurity region 49 is provided on the entire surface below the gate pad electrode 48 as in the conventional case (FIGS. 7A and 7B), a width of the p+ type impurity region 49 is, for example, about 400 μm. In this embodiment, the channel regions 4, the gate electrodes 13 and the like are disposed in a region secured by reducing the p+ type impurity region 29 (the gate extraction electrode 13a).

As described above, in this embodiment, the channel regions 4 (the body regions 14) are provided below the gate pad electrode 18 by the same design rules (size and impurity concentration) as those of the operation region 21. Thus, the same drain-source reverse breakdown voltage as that required for the operation region 21 can be secured below the gate pad electrode 18.

Moreover, when changing the breakdown voltage of the operation region 21, a predetermined breakdown voltage can also be secured below the gate pad electrode 18 by changing design values of the channel regions 4 in the operation region 21.

In the conventional case, the gate extraction electrode 43a having a large area and the p+ type impurity region 49 overlapping therewith are disposed below the gate pad electrode 48. When the breakdown voltage required for the operation region 51 is changed, the pattern (the curvature in the corner portion) of the p+ type impurity region 49 is also required to be accordingly changed.

However, according to this embodiment, a predetermined drain-source reverse breakdown voltage can be secured below the gate pad electrode 18 in conjunction with changes in design values of the channel regions 4 and the body regions 14 in the operation region 21.

The example where the source regions 15 are not disposed below the gate pad electrode 18 has been described above. Meanwhile, the same configuration as that of the transistor cell may be adopted also below the gate pad electrode 18 by providing the source regions 15 below the gate pad electrode 18. However, since the source electrode 17 is not disposed on the source regions 15 below the gate pad electrode 18, an uneven operation may be performed. Therefore, it is preferable that the source regions 15 are not provided below the gate pad electrode 18 when the uneven operation is not favorable, such as a case where the device is used for a switching component, in particular.

Figure 4:
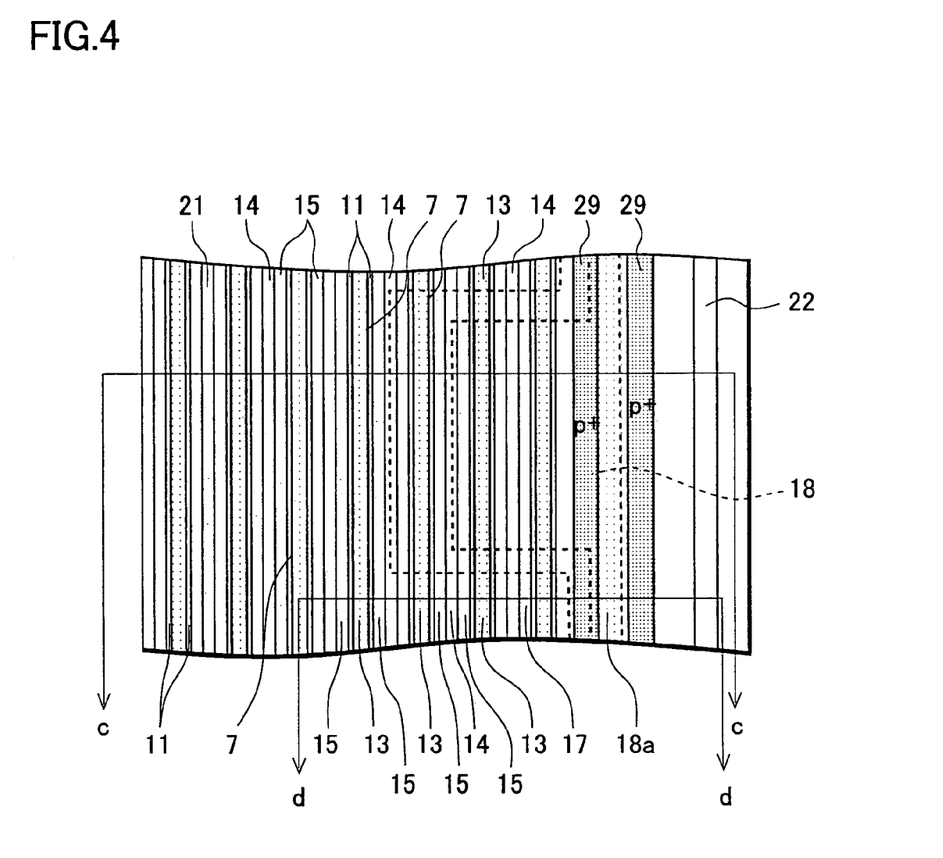
FIG. 4 is a plan view showing the semiconductor device of a second embodiment of the present invention.
Figure 5:
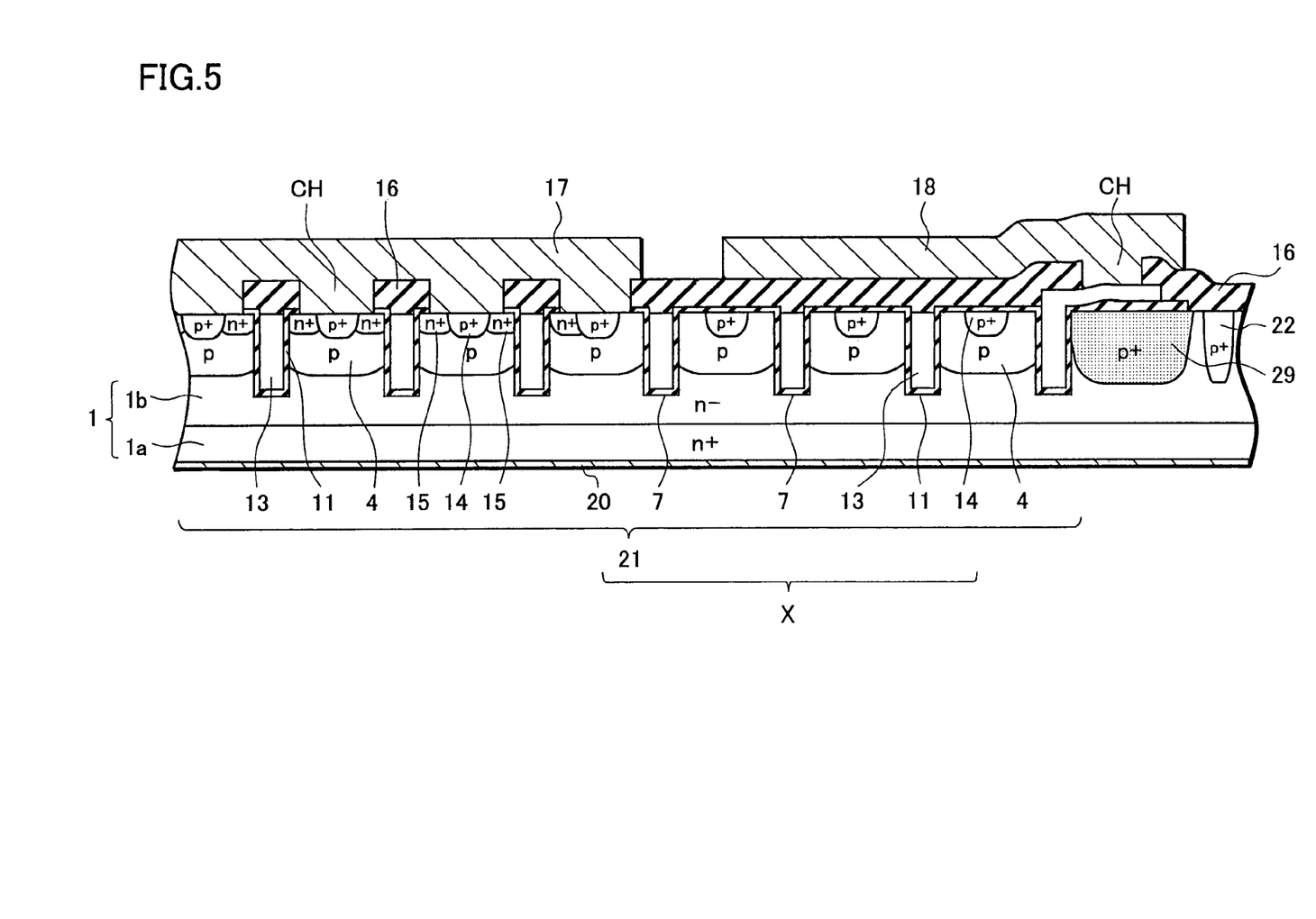
FIG. 5 is a cross-sectional view showing the semiconductor device of the second embodiment of the present invention.
Figure 6:
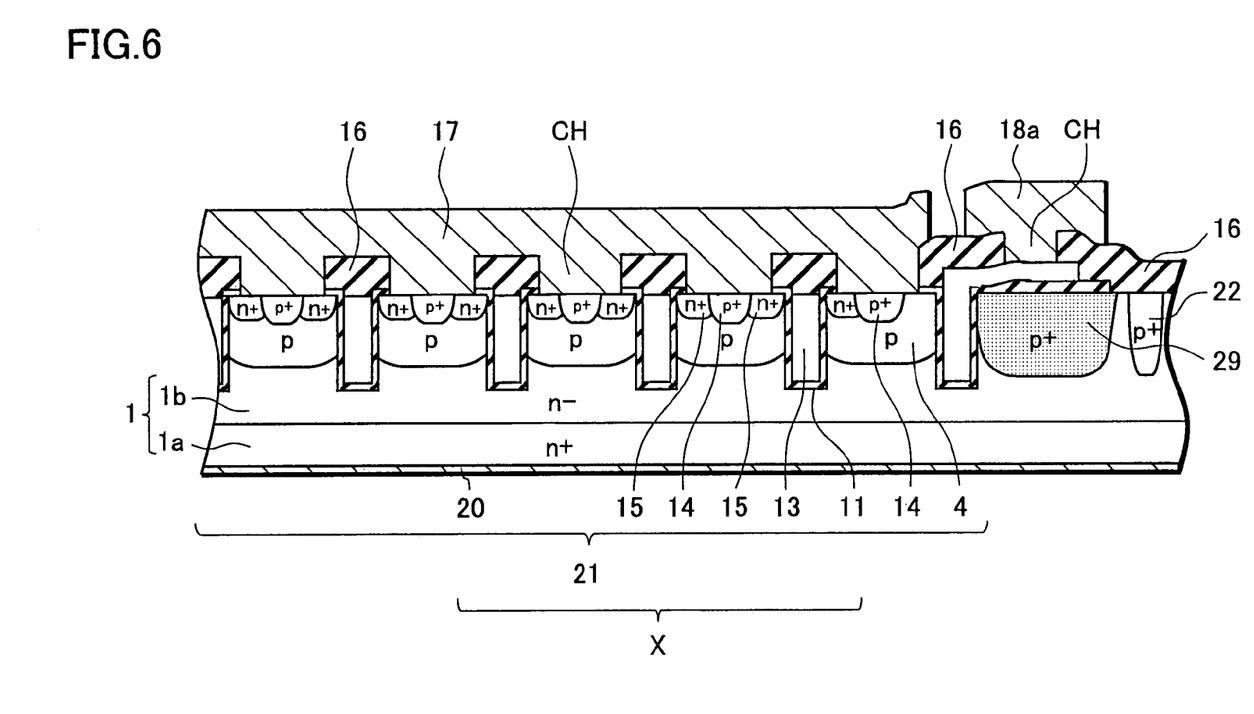
FIG. 6 is a cross-sectional view showing the semiconductor device of the second embodiment of the present invention.

FIGS. 4 to 6 show a second embodiment of the present invention. FIG. 4 is a partially enlarged view for explaining a transistor cell. The second embodiment is the same as that shown in FIGS. 1A and 1B except that the transistor cell has a trench structure. Therefore, FIGS. 1A and 1B will be referred to for a chip plan view of a MOSFET 100, and description of the same constituent components will be omitted.

FIG. 4 is a plan view in which interlayer insulating films are omitted and a metal electrode layer is indicated by a broken line. FIG. 5 is a cross-sectional view taken along the line c-c in FIG. 4. FIG. 6 is a cross-sectional view taken along the line d-d in FIG. 4.

In the first embodiment, adopted is a MOSFET which has gate electrodes formed in a so-called planar structure and has a vertical current path. On the other hand, in the second embodiment, a MOSFET having a trench structure is adopted.

With reference to FIG. 4, trenches 7 are provided in a stripe pattern in a planar pattern of an n type semiconductor substrate 1. In the planar pattern, gate electrodes 13, channel regions 4, source regions 15 and body regions 14 are all formed in the stripe pattern along the trenches 7.

Also in this case, transistor cells are formed in the stripe pattern, and a gate pad electrode 18 is provided so as to overlap with part of the channel regions 4 and the gate electrodes 13. A source electrode 17 and a gate wiring 18a have the same patterns as those in the first embodiment.

With reference to FIG. 5, each of the trenches 7 has a depth penetrating the channel regions 4 and reaching an n− type semiconductor layer 1b. In this case, the channel regions 4 may be continuously provided on a surface of the n type semiconductor substrate 1, for example, before forming of the trenches 7 and may be separated from each other by the trenches 7. Alternatively, the channel regions 4 may be impurity regions selectively formed adjacent to the trenches 7.

Inner walls of the trenches 7 are covered with gate oxide films 11, and the gate electrodes 13 made of polysilicon filled in the trenches 7 are provided.

Below a source electrode 17, the n+ type source regions 15 are formed on the surfaces of the channel regions 4 adjacent to the trenches 7. Moreover, the p+ type body regions 14 are provided on the surfaces of the channel regions 4 between the source regions 15 adjacent to each other.

Interlayer insulating films 16 are provided so as to cover the gate electrodes 13. Moreover, the source electrode 17 contacts the source regions 15 and the body regions 14 (the channel regions 4) through contact holes CH provided in the interlayer insulating films 16.

The trenches 7, the gate electrodes 13, the body regions 14 and the channel regions 4 are disposed also in the n type semiconductor substrate 1 below the gate pad electrode 18. However, the gate pad electrode 18 and the channel regions 4 never contact each other. The gate pad electrode 18 contacts a gate extraction electrode 13a on a p+ type impurity region 29 through a contact hole CH provided in the interlayer insulating films 16.

As shown in FIG. 6, also in the second embodiment, the transistor cell in a region X contact with the source electrode 17 which surrounds the gate pad electrode 18 and is adjacent thereto. Therefore, potentials of the transistor cells in the region X are fixed and a transistor operation is performed.

Moreover, the channel regions 4 below the gate pad electrode 18 are fixed at a source potential. Thus, the same drain-source reverse breakdown voltage as that in an operation region 21 can be secured.

In addition, by setting the gate electrodes 13 to have the trench structure, the transistor cells disposed in the operation region 21 can be increased compared with the first embodiment. Thus, cell density can be improved.

The embodiments of the present invention have been described by using the n channel MOSFET. However, the same effects can also be obtained by using a p channel MOSFET having a conductivity type reversed or an IGBT (Insulated Gate Bipolar Transistor) in which a p type (n type) substrate is disposed below an n+ (p+) type semiconductor substrate of a MOSFET.

According to the embodiment of the present invention, a MOSFET which secures a high drain-source reverse breakdown voltage can be provided without reducing an area of an operation region. Specifically, transistor cells are arranged in a stripe pattern, and patterns of a gate extraction electrode and a p+ type impurity region, which have heretofore been provided in a pattern approximately overlapping with a gate pad electrode, are reduced. Moreover, part of channel regions and gate electrodes and a part of the gate extraction electrode are disposed in a region secured by reducing the patterns as described above, and a source potential is applied to the channel regions below the gate pad electrode.

The channel regions below the gate pad electrode are formed in the same pattern as that of the operation region of the MOSFET. Thus, the same drain-source reverse breakdown voltage as that of the operation region can be secured also below the gate pad electrode.

Therefore, a predetermined breakdown voltage can be secured without changing the pattern of the p+ type impurity region (a curvature in a corner portion) according to the breakdown voltage. For example, when a breakdown voltage larger than a current one is secured, it is necessary to change the pattern of the p+ type impurity region. Accordingly, there is a problem that the operation region (a disposition area of the transistor cells) is reduced. However, according to the embodiments of the present invention, a predetermined drain-source reverse breakdown voltage can be secured while avoiding the problem described above.

What is claimed is:

1. An insulated gate semiconductor device comprising:
    a semiconductor substrate of a first general conductivity type;
    a plurality of gate electrodes formed on the semiconductor substrate and arranged in a first stripe pattern;
    a plurality of channel regions of a second general conductivity type formed on the semiconductor substrate and arranged in a second stripe pattern, the first and second stripe patterns being oriented in a first direction;
    a first insulating film disposed between the channel regions and the gate electrodes;
    a plurality of source regions of the first general conductivity type formed in corresponding channel regions and arranged in a third stripe pattern oriented in the first direction;
    a second insulating film disposed on the gate electrodes; and
    a gate pad electrode disposed on the second insulating film so as to overlay part of the channel regions,
    wherein there is no source region formed in the part of the channel regions overlaid by the gate pad electrode.

2. The insulated gate semiconductor device of claim 1, further comprising a plurality of contact holes formed in the second insulating film and a source electrode disposed on the second insulating film so as to contact, through the contact holes, corresponding source regions formed in the channel regions.

3. The insulated gate semiconductor device of claim 1, further comprising a gate extraction electrode disposed in a periphery of the semiconductor substrate and connecting the gate electrodes and the gate pad electrode, and a high-concentration region of the second general conductivity type formed on the substrate below the gate extraction electrode and connected with the channel regions.

4. The insulated gate semiconductor device of claim 2, wherein the channel regions located below the gate pad electrode are electrically connected with the source electrode.

5. The insulated gate semiconductor device of claim 1, wherein the gate electrodes are disposed in corresponding trenches formed in the semiconductor substrate so as to follow the second stripe pattern.

6. The insulated gate semiconductor device of claim 3, wherein part of the gate extraction electrode and part of the gate electrode are located below the gate pad electrode.

7. An insulated gate semiconductor device comprising:
    a semiconductor substrate of a first general conductivity type;
    a plurality of gate electrodes formed on the semiconductor substrate and arranged in a first stripe pattern;
    a plurality of channel regions of a second general conductivity type formed on the semiconductor substrate and arranged in a second stripe pattern, the first and second stripe patterns being oriented in a first direction;
    a first insulating film disposed between the channel regions and the gate electrodes;
    a plurality of source regions of the first general conductivity type formed in corresponding channel regions and arranged in a third stripe pattern oriented in the first direction;
    a second insulating film disposed on the gate electrodes;
    a gate pad electrode disposed on the second insulating film;
    a gate extraction electrode disposed in a periphery of the semiconductor substrate and connecting the gate electrodes and the gate pad electrode; and
    a high-concentration region of the second general conductivity type formed on the substrate below the gate extraction electrode and connected with the channel regions,
    wherein part of the channel regions, part of the gate extraction electrode and part of the gate electrodes are located below the gate pad electrode and corresponding portion of the second insulating film, and no part of the source regions is located below the gate pad electrode.

* * * * *